(12) United States Patent
Kondo

(10) Patent No.: US 7,406,112 B2
(45) Date of Patent: Jul. 29, 2008

(54) SURFACE-EMITTING LASER, METHOD FOR MANUFACTURING SURFACE-EMITTING LASER, DEVICE AND ELECTRONIC APPARATUS

(75) Inventor: Takayuki Kondo, Suwa (JP)

(73) Assignee: Seiko Epson Corporation (JP)

( * ) Notice: Subject to any disclaimer, the term of this patent is extended or adjusted under 35 U.S.C. 154(b) by 456 days.

(21) Appl. No.: 11/117,081

(22) Filed: Apr. 28, 2005

(65) Prior Publication Data

US 2005/0276299 A1    Dec. 15, 2005

(51) Int. Cl.
*H01S 5/00*         (2006.01)
(52) U.S. Cl. ............... 372/50.23; 372/50.1; 372/50.124
(58) Field of Classification Search ............... 372/50.1, 372/50.124, 50.23
See application file for complete search history.

(56) References Cited

U.S. PATENT DOCUMENTS 6,594,300 B2 *   7/2003   Wipiejewski ............... 372/96

FOREIGN PATENT DOCUMENTS

| JP | 10-056233 | 2/1998 |
|---|---|---|
| JP | 2000-076682 | 3/2000 |
| JP | 2002-214404 | 7/2002 |
| JP | 2002-368333 | 12/2002 |

* cited by examiner

*Primary Examiner*—Armando Rodriguez
(74) *Attorney, Agent, or Firm*—Harness, Dickey & Pierce, P.L.C.

(57) ABSTRACT

The present invention provides surface-emitting lasers that reduce a laser emission angle and are readily manufactured. Methods for manufacturing the surface-emitting lasers, devices, and electronic apparatuses are also described. The lasers are characterized in that a resonator of a surface-emitting laser includes a light emission surface having a portion that is provided with a lens shaped section formed from a semiconductor layer in a lens shape.

7 Claims, 5 Drawing Sheets

SURFACE-EMITTING LASER, METHOD FOR MANUFACTURING SURFACE-EMITTING LASER, DEVICE AND ELECTRONIC APPARATUS

CROSS-REFERENCE TO RELATED APPLICATIONS

This application relates to Japanese Patent Application 2003-387700, filed Nov. 18, 2003. The disclosure of the above application is incorporated herein by reference in its entirety.

FIELD OF THE INVENTION

The present invention relates to surface-emitting lasers, methods for manufacturing surface-emitting lasers, devices, and electronic apparatuses.

BACKGROUND OF THE INVENTION

Semiconductor lasers include edge-emitting lasers that emit a laser light at an edge of a semiconductor substrate, and surface-emitting lasers that emit a laser light from a surface of a semiconductor substrate. Surface-emitting lasers are characterized in that the laser emission angle is isotropic and small compared to edge-emitting lasers. When a surface-emitting laser is used as a light source for optical communications, for example, a large optical output is required. In order to increase the output of a surface-emitting laser, an enlargement of its laser emission aperture is effective. However, when the laser emission aperture is enlarged, the laser emission angle becomes larger. When the laser emission angle becomes larger, and for example, when the surface-emitting laser and an optical fiber are directly, optically coupled without a lens or the like, the optical coupling efficiency is lowered, and their mounting margin is reduced.

According to a conventional method to compose a smaller laser emission angle of a surface-emitting laser, an upper surface of a columnar section of a resonator of the surface-emitting laser is formed into a convex lens shape (lens layer or contact layer). An emitted light of the surface-emitting laser is converged by the lens layer or the contact layer, whereby the laser emission angle becomes smaller (for example, see FIG. 1, FIG. 7, and FIG. 8 of Japanese Laid-open Patent Application 2000-76682).

It is noted that, in the surface-emitting laser described with reference to FIG. 1, FIG. 7 and FIG. 8 of the aforementioned Japanese Laid-open Patent Application 2000-76682, the lens layer or the contact layer, which are formed in a lens shape, has an outer diameter that coincides with an outer diameter of the columnar section of the resonator. In actual surface-emitting lasers, the columnar section of the resonator is often provided with an outer diameter of 20 μm or greater. If the outer diameter of the columnar section is set to 20 μm or greater, and a sufficient lens curvature is to be provided to reduce the laser emission angle, the lens layer or the contact layer formed in a lens shape becomes too thick, and their manufacture becomes difficult.

On the other hand, a surface-emitting laser described with reference to FIG. 10 of the aforementioned Japanese Laid-open Patent Application 2000-76682 includes an entire columnar section of the resonator that is formed into a lens shape. In this manner, the curvature of the lens shape can be made smaller, and the laser emission angle can be made smaller. However, in such a conventional surface-emitting laser, because the entire columnar section of the resonator is formed into a curved surface, a sufficient contact surface cannot be provided between an upper electrode (an anode electrode or a cathode electrode of the surface-emitting laser) and the contact layer. Accordingly, the conventional surface-emitting laser has a problem in that an element resistance (resistance between an anode electrode and a cathode electrode) becomes higher.

SUMMARY OF THE INVENTION

The present invention has been made in view of the problems described above, and its object is to provide surface-emitting lasers that can reduce the laser emission angle and can be readily manufactured. The present invention also provides methods for manufacturing the surface-emitting lasers, devices including the surface-emitting lasers, and electronic apparatuses including the surface-emitting lasers.

Also, it is an object of the present invention to provide surface-emitting lasers that can reduce the laser emission angle, that can be readily manufactured, and that can reduce element resistance. Methods for manufacturing the surface-emitting lasers, devices, and electronic apparatuses are also provided.

Further, it is an object of the present invention to provide a method for manufacturing a surface-emitting laser that automatically matches a center axis of a columnar section of a resonator of the surface-emitting laser with an optical axis of a lens section that reduces the laser emission angle.

To achieve the objects described above, a surface-emitting laser in accordance with the present invention is characterized in that a resonator of the surface-emitting laser includes a light emission surface having a portion that is provided with a lens shaped section formed from a semiconductor layer.

According to the present invention, the lens shaped section is provided in a portion of the emission surface of the resonator (i.e., an upper surface of the columnar section of the resonator). Accordingly, the lens shaped section can be made into a convex lens with a small curvature, and the laser emission angle of the surface-emitting laser can be made sufficiently small due to the lens shaped section. Furthermore, because the laser emission angle can be made sufficiently small by the lens shaped section, and the lens shaped section can be made thinner, it is possible to provide a high performance surface-emitting laser that can be readily manufactured.

Also, in the surface-emitting laser in accordance with the present invention, the resonator may have a columnar section formed in a convex shape on a semiconductor substrate. The light emission surface may be defined by an upper surface of the columnar section, and a contact layer may preferably be exposed around the lens shaped section on the light emission surface.

According to the present invention, the contact layer can be structured to be exposed in a region other than the lens shaped section in the light emission surface of the resonator such that a contact area of an electrode to be connected with the contact layer can be made larger. In other words, unlike the conventional surface-emitting laser in which a contact layer is formed on a curved surface, the contact layer is formed on a planar surface on the columnar section such that a contact surface between the contact layer and an electrode (for example, an upper electrode) can be made larger. Therefore, according to the present invention, the element resistance of the surface-emitting laser can be made smaller, and a high performance surface-emitting laser can be readily provided.

Also, in the surface-emitting laser in accordance with the present invention, the lens shaped section may preferably be disposed on an upper surface of the contact layer.

According to the present invention, the contact layer can be disposed on the semiconductor layer composing a DBR (Distributed Bragg Reflector) without being obstructed by the lens shaped section. Also, the lens shaped section can be readily composed. Accordingly, there is provided a high performance surface-emitting laser in which the lens shaped section can be formed thin, and the laser emission angle can be made sufficiently small.

Also, in the surface-emitting laser in accordance with the present invention, an upper electrode that has a ring shape and is in ohmic contact with the contact layer may preferably be provided in a region in the upper surface of the contact layer where the lens shaped section is not provided.

According to the present invention, the region where the contact layer and the upper electrode are in ohmic contact is disposed on an upper surface of the contact layer. In other words, on a plane surface on the columnar section of the resonator such that the contact area between the contact layer and the upper electrode can be made larger. Accordingly, the element resistance of the surface-emitting laser can be readily made smaller, and a high performance surface-emitting laser can be readily provided.

Also, in the surface-emitting laser in accordance with the present invention, the lens shaped section may preferably be composed of a semiconductor layer having a bandgap greater than a bandgap corresponding to energy of a laser light of the surface-emitting laser, and the contact layer may preferably be composed of a semiconductor layer having a bandgap smaller than the bandgap of the semiconductor layer composing the lens shaped section.

According to the present invention, because the bandgap of the contact layer is smaller than that of the lens shaped section, for example, good ohmic contact between the upper electrode and the contact layer can be achieved. Also, by making the bandgap of the lens shaped section larger as described above, absorption loss of the laser light at the lens shaped section can be suppressed to a minimum. Accordingly, improvement of ohmic contact and prevention of absorption loss can both be established.

Also, in the surface-emitting laser in accordance with the present invention, the lens shaped section may preferably be composed of a plurality of layers that include different refractive indexes. Furthermore, the plurality of layers may have refractive indexes that change in multiple stages. According to the present invention, for example, when refractive indexes of the plurality of layers change in multiple stages, and when the lens shaped section is in a spherical shape, its spherical aberration can be effectively corrected.

Also, in the surface-emitting laser in accordance with the present invention, the lens shaped section may preferably be composed of a single layer. According to the present invention, semiconductor layers do not need to be laminated for forming the lens shaped section, and therefore the number of manufacturing steps can be reduced.

Also, the surface-emitting laser in accordance with the present invention may preferably be formed in a micro-tile shape. For example, a surface-emitting laser in a micro-tile shape can be formed by using a so-called epitaxial-lift-off (ELO) method in which a functional section composing the surface-emitting laser is formed on a semiconductor substrate, and the functional section is cut and removed from the semiconductor substrate. Therefore, according to the present invention, there can be provided a surface-emitting laser in a micro-tile shape that can be adhered to an arbitrary position of an arbitrary substrate (final substrate), that can sufficiently reduce the laser emission angle, that can lower the element resistance, and that can be readily manufactured.

Also, in the surface-emitting laser in accordance with the present invention, a dielectric film may preferably be arranged around the columnar section that defines at least a part of the resonator of the surface-emitting laser.

According to the present invention, an electrode (for example, an upper electrode) connected to the contact layer arranged on the emission surface of the resonator can be prevented by the dielectric film from becoming short-circuited with other semiconductor portions of the resonator. Also, a step difference between an upper surface and a side surface of the columnar section composing the resonator can be eliminated by the dielectric film, such that the electrode connected to the contact layer can be formed in a smooth plane surface or curved surface without a step difference, and the electrode can be excellently and readily composed. It is noted that, for example, the dielectric film may consist of polyimide.

Also, to achieve the objects described above, a device in accordance with the present invention is characterized in comprising the surface-emitting laser described above. There can be provided, a device equipped with a surface-emitting laser that can make the laser emission angle sufficiently small, that can sufficiently lower the element resistance, and that can be readily manufactured.

Also, to achieve the objects described above, a method for manufacturing a surface-emitting laser in accordance with the present invention is characterized in comprising: forming a lower DBR layer on a semiconductor substrate; forming an active layer on the lower DBR layer; forming an upper DBR layer on the active layer; forming a contact layer on the upper DBR layer; forming a lens layer on the contact layer; forming a resist mask in a lens shape on the lens layer; removing at least the lens layer, the contact layer and the upper DBR layer by etching to thereby form a columnar section; isotropically reducing the resist mask by etching such that an outer diameter of the resist mask becomes smaller than an outer diameter of an upper surface of the columnar section; and forming the lens layer into a lens shape on a portion of the contact layer by etching by using the reduced resist mask.

According to the present invention, the columnar section that forms the resonator and the lens layer in a lens shape are formed by conducting isotropic etching by using the resist mask in a lens shape such that an axis of the columnar section and an axis of the lens shape of the lens layer can be matched in a self-aligning manner. Accordingly, a laser optical axis of the resonator formed by the columnar section and an axis of the lens shape that reduces the laser emission angle can be matched in a self-aligning manner such that a high performance surface-emitting laser can be readily manufactured. Also, because the lens layer in a lens shape can be formed in a portion of the columnar section, the lens shape can be formed into a convex lens with a small curvature, and the laser emission angle of the surface-emitting laser can be made sufficiently small by the lens shape. Furthermore, because the lens shape can be made thinner, a high performance surface-emitting laser can be readily manufactured.

Also, in the method for manufacturing a surface-emitting laser in accordance with the present invention, in the etching conducted when forming the columnar section, dry-etching at a high selection ratio may preferably be conducted such that the resist mask is hardly etched.

According to the present invention, almost all of the resist mask in a lens shape can be left as it is in the etching step to form the columnar section that composes a part or an entirety of the resonator. Accordingly, the lens layer, the contact layer and the upper DBR layer at a bottom surface section of the resist mask are left without being etched in the etching step, such that the columnar section composing a part or an entirety of the resonator can be formed.

Also, in the method for manufacturing a surface-emitting laser in accordance with the present invention, in the etching conducted when isotropically reducing the resist mask, oxygen plasma or ozone may preferably be used.

According to the present invention, the resist mask can be isotropically reduced or shrunk by oxygen plasma or ozone. Accordingly, on an upper surface of the columnar section composing a part or an entirety of the resonator, the resist mask having an outer diameter smaller than an outer diameter of the upper surface can be formed. Further, by the above-described etching, a center axis of the columnar section and a center axis of the resist mask in a lens shape can be matched in a self-aligning manner, such that a high performance surface-emitting laser can be readily manufactured.

Also, in the method for manufacturing a surface-emitting laser in accordance with the present invention, in the etching conducted when forming the lens layer into a lens shape, dry-etching at a low selection ratio may preferably be conducted such that the resist mask is also etched with the lens layer.

According to the present invention, by the etching described above, the lens shape of the resist mask can be transferred to the lens layer. In other words, the lens shape of the resist mask appears in relief on the upper surface of the columnar section composing the resonator. Accordingly, by providing the lens shape on a part of the upper surface of the columnar section, the lens shape can be made thinner and the laser emission angle can be made sufficiently smaller, and the laser optical axis that is an axis of the columnar section can be matched with the axis of the lens shape in a self-aligning manner, such that a high performance surface-emitting laser can be readily manufactured.

Furthermore, an electronic apparatus in accordance with the present invention is characterized in comprising the surface-emitting laser described above or the device described above. According to the present invention, the laser emission angle can be made smaller, the element resistance can be lowered, and an electronic apparatus equipped with a surface-emitting laser that can be readily manufactured can be provided.

DETAILED DESCRIPTION OF THE PREFERRED EMBODIMENTS

Figure 1:
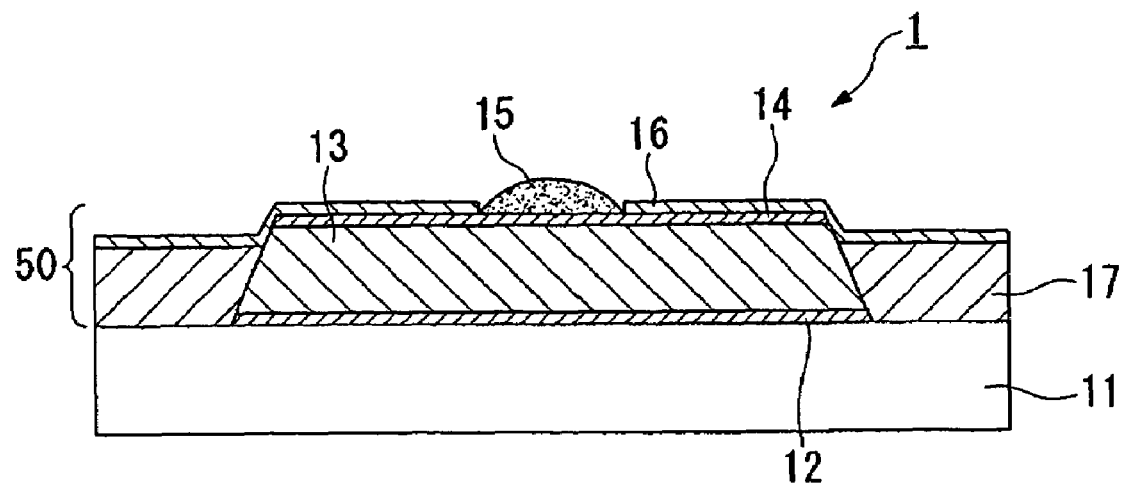
FIG. 1 is a schematic cross-sectional view of a surface-emitting laser in accordance with a principle of the present invention.

A surface-emitting laser according to the present invention is described below with reference to the accompanying drawings. FIG. 1 schematically shows a cross-sectional view of an example of a surface-emitting laser according to the present invention. A surface-emitting laser 1 shown in FIG. 1 is formed from a lower DBR 11, an active layer 12, an upper DBR 13, a contact layer 14, a lens shaped section 15, an upper electrode 16, and a dielectric film 17.

The lower DBR 11 is provided on, for example, an n-type GaAs substrate (not shown). The lower DBR 11 forms a distributed reflection type multilayer mirror (DBR mirror) of 25 pairs of alternately laminated, for example, "$Al_{0.15}Ga_{0.85}As$" and "$Al_{0.9}Ga_{0.1}As$" layers. The active layer 12 is provided on the lower DBR 11. The active layer is composed of, for example, GaAs well layers having a thickness of 3 nm and $Al_{0.3}Ga_{0.7}As$ barrier layers having a thickness of 3 nm in which the well layers form a quantum well active layer composed of three layers. The upper DBR 13 is provided on the active layer 12. The upper DBR 13 forms a distributed reflection type multilayer mirror (DBR mirror) of 30 pairs of alternately laminated, for example, "$Al_{0.15}Ga_{0.85}As$" and "$Al_{0.9}Ga_{0.1}As$" layers.

The lower DBR 11 is formed to be an n-type semiconductor by doping Si, and the upper DBR 13 is formed to be a p-type semiconductor by doping C. The active layer 12 is not doped with an impurity. Accordingly, the lower DBR 11, the active layer 12, and the upper DBR 13 form a pin diode, thereby composing a resonator of the surface-emitting laser. The active layer 12 and the upper DBR 13 in the resonator compose a columnar section 50 formed in a convex shape on an upper surface of the lower DBR 11 and the semiconductor substrate. It is noted that a portion in the lower DBR 11 adjacent to its upper surface can be a part of the columnar section 50. The upper surface and the lower surface of the columnar section 50 define emission surfaces of a laser light of the surface-emitting laser 1.

The contact layer 14 is provided on the upper DBR 13; in other words, on the upper surface of the columnar section 50, and forms a part of the columnar section 50. The contact layer 14 needs to be composed of a material that can be in ohmic contact with the upper electrode 16. For example, in the case of AlGaAs material, the contact layer 14 may be composed of $Al_{0.15}Ga_{0.85}As$ doped with a high concentration impurity of $10^{19}$ cm$^{-3}$ or greater.

The lens shaped section 15, which is one of the characteristic compositions of the present embodiment, is provided on an upper surface of the contact layer 14. Then, the lens shaped section 15 is provided in a portion of the contact layer 14; in other words, in a portion of an upper surface (a light emission surface of the resonator) of the columnar section 50, and is composed of a semiconductor layer in a convex lens shape. In other words, the outer diameter of the convex lens shape of the lens shaped section 15 is smaller than the outer diameter of the upper surface (an upper surface of the contact layer 14) of the columnar section 50. Also, the lens shaped section 15 is disposed on the upper surface of the columnar section 50 in a manner that the center axis of the convex lens shape of the lens shaped section 15 concurs with the center axis of the columnar section 50. Accordingly, the contact layer 14 is exposed around the lens shaped section 15 in the light emission surface that is an upper surface of the columnar section 50.

The dielectric film 17 is disposed so as to cover a major portion of a side surface of the columnar section 50 and the upper surface of the lower DBR 11. The upper electrode 16 is in ohmic contact with the contact layer 14 in an area of the upper surface of the contact layer 14 where the lens shaped section 15 is not disposed (i.e., an exposed portion of the contact layer 14). The upper electrode 16 has a ring shape that surrounds the circumference of the lens shaped section 15, and has a portion that covers the upper surface of the dielectric film 17. Also, the surface-emitting laser 1 of the present embodiment is equipped with a lower electrode (not shown) that is in ohmic contact with the lower DBR 11. The lower electrode is provided on, for example, the entire bottom surface of the lower DBR 11.

A voltage is applied across the upper electrode 16 and the lower electrode in the surface-emitting laser 1 thus structured, such that a potential in a forward direction is impressed to the pin diode. Then, recombinations of electrons and holes occur in the active layer 12, thereby causing emission of light due to the recombinations. Stimulated emission occurs during the period the generated light reciprocates between the upper DBR 13 and the lower DBR 11, whereby the light intensity is amplified. When the optical gain exceeds the optical loss, laser oscillation occurs, whereby a laser light is emitted from an aperture section of the upper electrode 16 in a direction orthogonal to the substrate. The laser light is refracted as it passes through the lens shaped section 15, whereby the laser emission angle is narrowed.

According to the above, in the surface-emitting laser 1 of the present embodiment, the lens shaped section 15 is provided in a portion of the contact layer 14 that is a light emission surface of the resonator (i.e., the upper surface of the columnar section 50 of the resonator), such that the lens shaped section 15 can be formed into a convex lens with a small curvature. Accordingly, the laser emission angle can be made sufficiently small by the lens shaped section 15, and the lens shaped section 15 can be made thinner. Thus, according to the present embodiment, there can be provided a surface-emitting laser that can be readily manufactured and that has a high performance.

Also, the surface-emitting laser 1 of the present embodiment can be structured such that the contact layer 14 is exposed in a region other than the lens shaped section 15 in the light emission surface of the resonator. Therefore, a contact area of the upper electrode 16 that is to be connected to the contact layer 14 can be made larger. In other words, unlike the conventional surface-emitting laser in which a contact layer is formed on a curved surface, the contact layer 14 is formed on a planar surface on the columnar section 50 such that a contact area between the contact layer 14 and the upper electrode 16 can be made larger. Accordingly, in accordance with the present embodiment, the element resistance of the surface-emitting laser 1 can be made smaller.

In the surface-emitting laser 1 thus composed, the contact layer 14 may preferably be formed from a semiconductor layer having a bandgap smaller than a bandgap of a semiconductor layer composing the lens shaped section 15. In this manner, by using a semiconductor having a small bandgap as the contact layer 14, for example by using GaAs doped with a high concentration impurity, an excellent ohmic contact between the contact layer 14 and the upper electrode 16 can be achieved.

Also, the lens shaped section 15 may preferably be formed from a semiconductor layer having a bandgap greater than a bandgap corresponding to the energy of the laser light of the surface-emitting laser 1. By so doing, absorption loss of the laser light at the lens shaped section 15 can be suppressed to a minimum. Also, in accordance with the present embodiment, because the lens shaped section 15 can be made thinner than the conventional ones, absorption loss of the laser light at the lens shaped section 15 can be suppressed more than the conventional ones.

Moreover, the lens shaped section 15 may be composed of multiple layers of different refractive indexes. The multiple layers may have refractive indexes that change in multiple stages. For example, the convex lens shape of the lens-shaped section 15 may be divided in two layers, wherein the lower layer may have a lower refractive index and the upper layer may have a higher refractive index. By such a structure, even when the convex lens shape of the lens-shaped section 15 is a spherical convex lens shape, it demonstrates effects equal to those of a convex lens shape that has a simple curved surface, in other words, an aspheric surface, and spherical aberration can be effectively corrected. Alternatively, the lens-shaped section 15 may be composed of a single layer. Bo so doing, semiconductor layers do not need to be laminated to form the lens-shaped section 15, and the number of manufacturing steps can be reduced.

Also, the surface-emitting laser 1 of the present embodiment may be formed into a very small tile shape (a micro-tile shape). The surface-emitting laser 1 in the micro-tile shape may be in a plate shape with its thickness being 20 µm or less, and its length and breadth being several ten µm to several hundred µm, for example.

A method for manufacturing the surface-emitting laser 1 of a micro-tile shape is described below. First, a sacrificial layer is formed on a semiconductor substrate (first substrate), and then a functional layer (electronic functional section) composing the surface-emitting laser 1 shown in FIG. 1 is laminated on the sacrificial layer. Then, the sacrificial layer is etched, thereby cutting and separating the surface-emitting laser 1 in a micro-tile shape from the semiconductor substrate. In this manner, the surface-emitting laser 1 in a micro-tile shape is completed. It is noted that the lower electrode may be formed after the step of separation described above is conducted. By using such an epitaxial lift-off (ELO) method, the surface-emitting laser 1 in a micro-tile shape can be readily manufactured. By so doing, there can be provided a surface-emitting laser in a micro-tile shape that can be attached to an arbitrary position of an arbitrary substrate (final substrate), that can make the laser emission angle sufficiently small, and that can lower the element resistance, and there can be provided a surface-emitting laser that can be readily manufactured.

<Manufacturing Method>

Next, a method for manufacturing the surface-emitting laser 1 thus structured is described with reference to FIG. 2 through FIG. 8.

<First Step>

Figure 2:
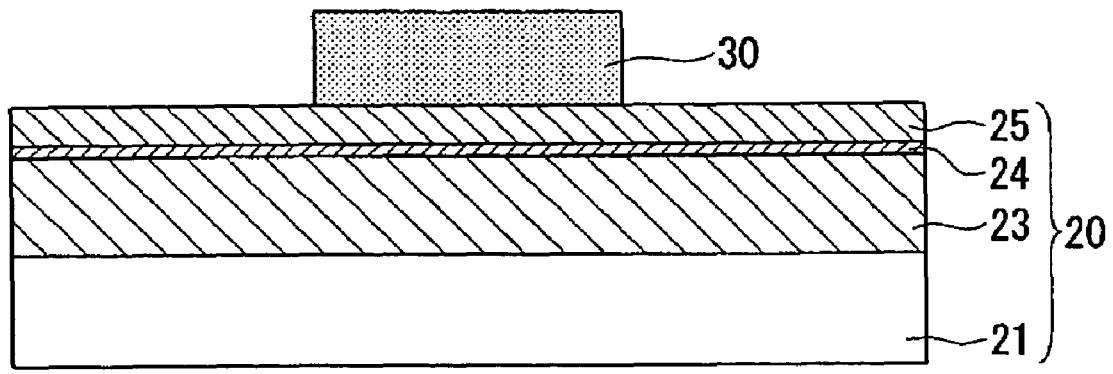
FIG. 2 is a schematic cross-sectional view illustrating a first step of a manufacturing method in accordance with a principle of the present invention.

FIG. 2 is a schematic cross-sectional view showing a first step of the manufacturing method according to the present invention. First, a lower DBR layer 21 composed of 25 pairs of alternately laminated $Al_{0.15}Ga_{0.85}As$ and AlAs layers and doped with Se is formed on, for example, an n-type GaAs substrate (not shown). The lower DBR layer 21 corresponds to the lower DBR 11 in FIG. 1. Next, on the lower DBR layer 21 is formed an active layer (not shown) composed of GaAs well layers having a thickness of 3 nm and $Al_{0.3}Ga_{0.7}As$ barrier layers having a thickness of 3 nm in which the well layers are composed of three layers. The active layer is a source of the active layer 12 in FIG. 1. Further, on the active layer, an upper DBR layer 23 composed of 30 pairs of alternately laminated $Al_{0.15}Ga_{0.85}As$ and $Al_{0.9}Ga_{0.1}As$ layers and doped with Zn is formed. The upper DBR layer 23 is a source of the upper DBR 13 in FIG. 1. Then, a contact layer 24 composed of $Al_{0.15}Ga_{0.85}As$ is laminated on the upper DBR layer 23. This contact layer 24 is a source of the contact layer 14 in FIG. 1. Then, a lens layer 25 is formed on the contact layer 24. The lens layer 25 may be a semiconductor having a bandgap greater than a bandgap corresponding to the energy of a laser light of the surface-emitting laser 1. The lens layer 25 is a source of the lens shaped section 15 in FIG. 1.

Epitaxial layers 20 composed of the lower DBR layer 21, the active layer, the upper DBR layer 23, the contact layer 24 and the lens layer 25 can be epitaxially grown by a metal organic vapor phase growth (MOVPE: Metal-Organic Vapor Phase Epitaxy) method. In this instance, for example, the growth temperature may be 750° C., the growth pressure may be $2 \times 10^4$ Pa, organic metals such as TMGa (trimethyl gallium) and TMAl (trimethyl aluminum) may be used as III-group material, $AsH_3$ may be used as V-group material, $H_2Se$ may be used as n-type dopant, and DEZn (dimethyl zinc) may be used as p-type dopant.

Next, a photoresist is coated on the lens layer 25, and then the photoresist is patterned by photolithography. In this manner, a resist layer 30 having a predetermined pattern is formed, as shown in FIG. 2.

<Second Step>

Figure 3:
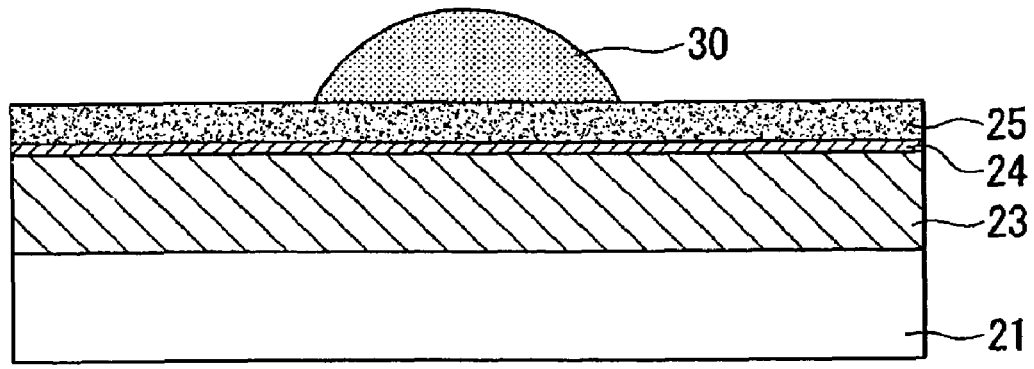
FIG. 3 is a cross-sectional view illustrating a second step of the above manufacturing method.

FIG. 3 is a schematic cross-sectional view showing a second step of the manufacturing method according to the present invention. In this step, the resist layer 30 is formed into a convex lens shape. Concretely, the resist layer 30 is heated and re-flowed; in other words, a melted resist is flowed and re-formed. By this, the resist layer 30 is influenced by surface tension and is transformed into a convex lens shape shown in FIG. 3. The heating method can be conducted by using, for example, a hot plate, a heated air-circulation-type oven or the like. Conditions when a hot plate is used may differ depending on the material quality of the resist, and may be 2-10 minutes, and more preferably be 5 minutes at 150° C. or higher. Also, in the case of a heated air circulation type oven, it may preferably be 20-30 minutes at 160° C. or higher. It is noted that the resist layer 30 may be formed into a convex lens shape by using a gray mask, without heating.

<Third Step>

Figure 4:
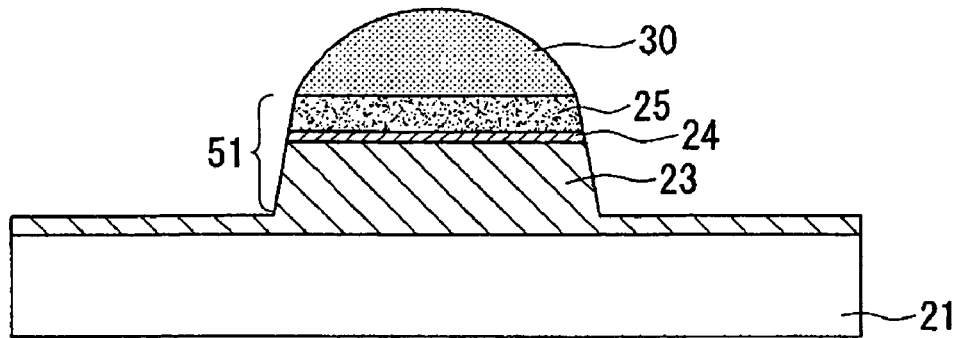
FIG. 4 is a cross-sectional view illustrating a third step of the above manufacturing method.

FIG. 4 is a schematic cross-sectional view showing a third step of the manufacturing method according to the present invention. In this step, as shown in FIG. 4, a columnar section composed of the upper DBR layer 23, the contact layer 24 and the lens layer 25 is formed. Concretely, by using the resist layer 30 in a convex lens shape as a mask, dry-etching at a high selection ratio is conducted. In other words, while the resist layer 30 is almost entirely left as it is, the lens layer 25, the contact layer 24 and halfway through the upper DBR layer 23 are etched in a mesa shape, thereby forming a columnar section 51. The selection ratio at etching may preferably be 2.0 or greater, for example.

<Fourth Step>

Figure 5:
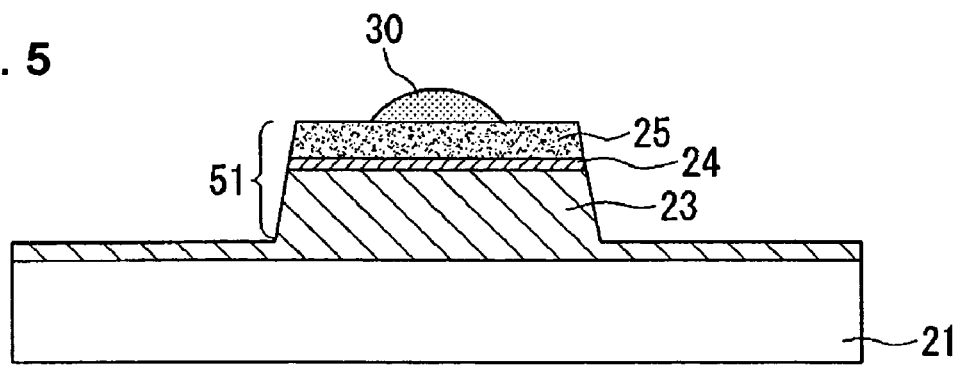
FIG. 5 is a cross-sectional view illustrating a fourth step of the above manufacturing method.

FIG. 5 is a schematic cross-sectional view showing a fourth step of the manufacturing method according to the present invention. In this step, as shown in FIG. 5, the resist layer 30 in a convex lens shape is isotropically reduced. Concretely, by using oxygen plasma or ozone, only the resist layer 30 is shrunk in a similar configuration. By this, the resist layer 30 becomes to have a convex lens shape having a center axis that coincides with a center axis of the columnar section described above, and has an outer diameter smaller than the outer diameter of the upper surface of the columnar section.

<Fifth Step>

Figure 6:
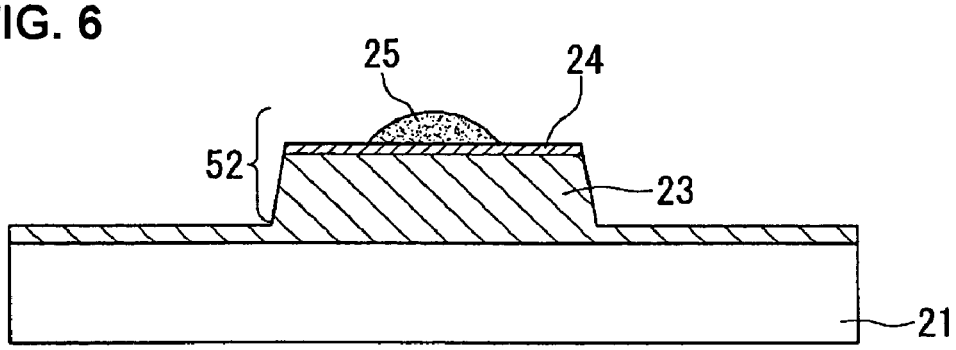
FIG. 6 is a cross-sectional view illustrating a fifth step of the above manufacturing method.

FIG. 6 is a schematic cross-sectional view showing a fifth step of the manufacturing method according to the present invention. In this step, the lens layer 25 is transformed to have a configuration that is generally the same as the configuration of the resist layer 40 after the fourth step, into a convex lens shape shown in FIG. 6. Concretely, by using the shrunk resist layer 30 in a convex lens shape as a mask, dry-etching at a low selection ratio is conducted. By this, the resist layer 30, the lower DBR layer 21, the active layer, the upper DBR layer 23, the contact layer 24 and the lens layer 25 are simultaneously etched. Then, the reduced resist layer 30 in a convex lens shape is removed by etching, and the lens layer 25 is etched into a reduced convex lens shape. It is noted that, by the etching in the present step, parts of the active layer and the lower DBR layer 21 are also etched, such that a columnar section 52 is formed by a part of the lower DBR layer 21, the active layer, the upper DBR layer 23 and the contact layer 24.

<Sixth Step>

Figure 7:
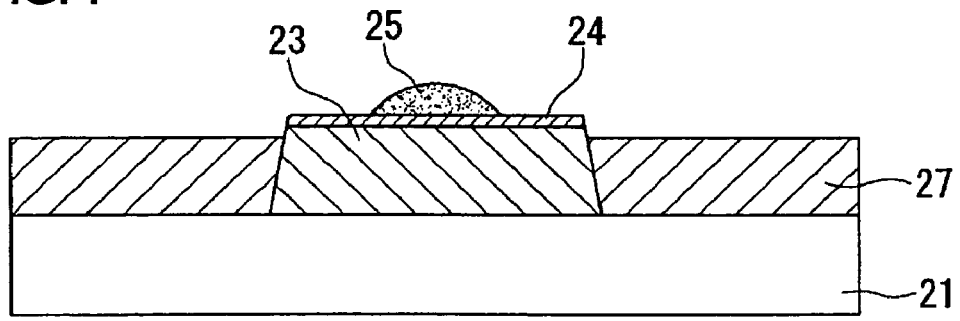
FIG. 7 is a cross-sectional view illustrating a sixth step of the above manufacturing method.

FIG. 7 is a schematic cross-sectional view showing a sixth step of the manufacturing method according to the present invention. In this step, a dielectric film 27 is formed around a columnar section 52 composed of a part of the lower DBR layer 21, the active layer, the upper DBR layer 23 and the contact layer 24. Concretely, the dielectric film 27 is deposited to a height adjacent to the contact layer 24 in the columnar section 52 around the columnar section 52, so that the columnar section 52 is embedded in the dielectric film 27 to that height. For example, polyimide may be used as a constituting material of the dielectric film 27. For example, polyimide in a liquid state may be coated around the columnar section 52 by a droplet ejection method, and then the polyimide may be hardened by sintering, whereby the dielectric film 27 can be readily formed. By forming the dielectric film 27, an electrode (an upper electrode) that is to be connected to the contact layer 24 in a later step can be prevented from becoming short-circuited with undesired portions. Also, an area around the contact layer 24 is planarized by the dielectric film 27, such that formation of an electrode (an upper electrode) to be connected to the contact layer 24 becomes facilitated.

<Seventh Step>

Figure 8:
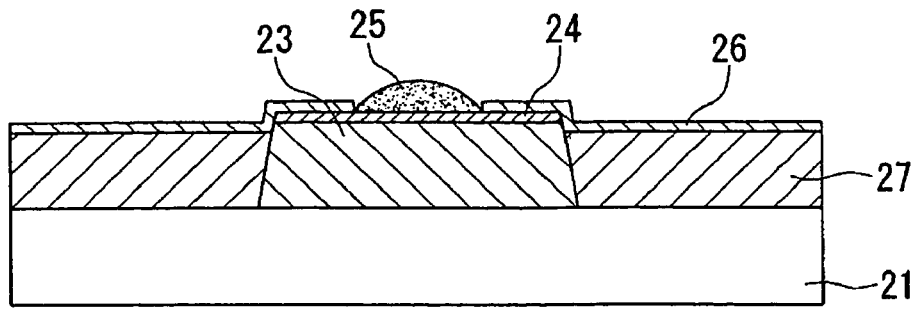
FIG. 8 is a cross-sectional view illustrating a seventh step of the above manufacturing method.

FIG. 8 is a schematic cross-sectional view showing a seventh step of the manufacturing method according to the present invention. In this step, an upper electrode 26 that is in ohmic contact with the contact layer 24 is formed. Concretely, the upper electrode 26 is formed around the lens layer 25 in a convex lens shape in the planar surface on the columnar section 52, in other words, on the contact layer 24 formed in a ring shape around the lens layer 25. It is noted here that the upper electrode 26 is brought into ohmic contact with the contact layer 24. Also, the upper electrode 26 is formed up to the upper surface of the dielectric film 27 formed around the columnar section 52. The upper electrode 26 may be formed by forming an Au—Ge alloy film by, for example, a vacuum deposition method, and patterning the alloy film by etching.

After the present step, a lower electrode (not shown) that is in ohmic contact with the lower DBR layer 21 is formed, whereby the surface-emitting laser 1 shown in FIG. 1 is completed. It is noted that the lower electrode can be formed in a similar manner as the upper electrode 26.

In view of the above, according to the present manufacturing method, in the fifth step, the lens layer 25 in a convex lens shape can be formed in a portion of the upper surface of the columnar section 52 composing the resonator of the surface-emitting laser. Accordingly, the lens layer 25 can be readily formed into a convex lens with a smaller curvature than the prior art, the laser emission angle can be made sufficiently small by the lens layer 25, and the lens layer 25 can be made thinner than the prior art.

Also, according to the present manufacturing method, in the fifth step, the contact layer 24 can be exposed in a plane region outside the lens layer 25 in the light emission surface of the resonator formed by the columnar section 52. Also, the upper electrode 26 can be brought into ohmic contact with the exposed portion of the contact layer 24 in the seventh step. Therefore, according to the present manufacturing method, the contact layer 24 and the upper electrode 26 can be structured to be in contact with each other in a planar surface on the columnar section 52, such that a contact area between the contact layer 24 and the upper electrode 26 can be made greater. Therefore, according to the manufacturing method according to the present invention, the element resistance of the surface-emitting laser can be made smaller, and a high performance surface-emitting laser can be provided.

Also, according to the manufacturing method according to the present invention, the convex lens shape of the resist layer 30 can be isotropically shrunk in the fourth step, such that the laser optical axis that is the center axis of the columnar section 51, 52 that forms the resonator can be matched in a self-aligning manner with the center axis of the convex lens shape of the lens layer 25 that is formed in the fifth step. Therefore, according to the manufacturing method according to the present invention, alignment of these optical axes becomes unnecessary, such that a high performance surface-emitting laser can be readily manufactured.

<Electronic Apparatus>

Figure 9:
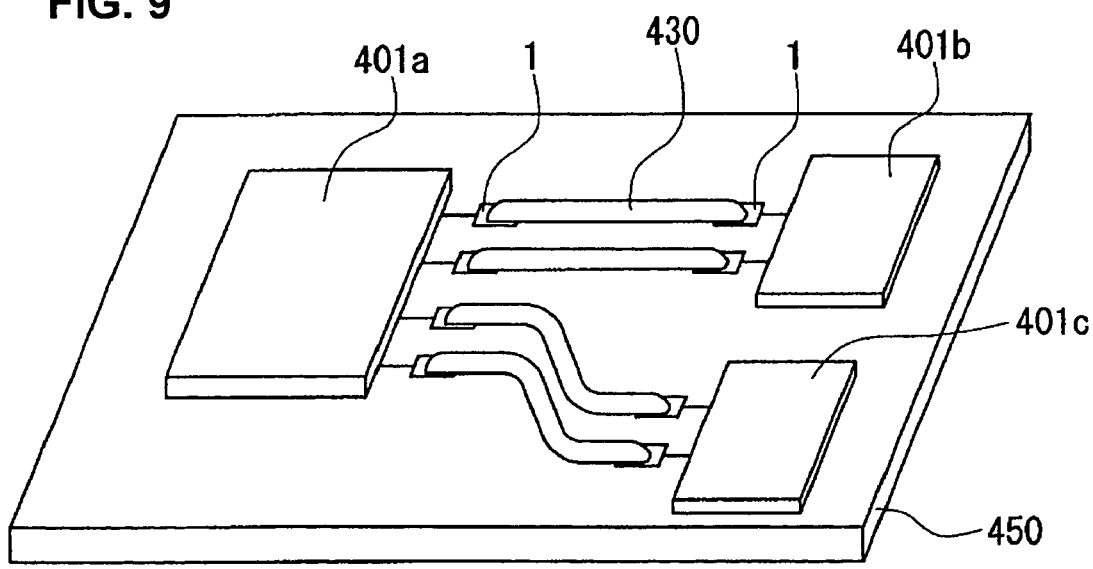
FIG. 9 is a perspective view of ah optical interconnection circuit among IC chips equipped with surface-emitting lasers of the present invention.

Next, an example of an electronic apparatus equipped with a surface-emitting laser 1 in accordance with the present embodiment described above is described. FIG. 9 is a perspective view of an optical-interconnection circuit between IC chips equipped with surface-emitting lasers 1 according to the present embodiment. The electronic apparatus of the present embodiment is an optical-interconnection circuit between IC chips which performs optical communications by using surface-emitting lasers 1 among a plurality of integrated circuit chips (IC chips, LSI chips and the like) disposed on a substrate. As the electronic apparatus of the present embodiment, an exemplary structure in which the surface-emitting lasers 1 are each formed in a minute tile shape (micro-tile shaped elements), and the surface-emitting lasers 1 are attached to a substrate (final substrate) 450 is shown. However, it is noted that surface-emitting lasers 1 may be formed directly on a substrate 450 by epitaxial growth or the like.

A plurality of LSIs (integrated circuits) 401a, 401b and 401c are mounted on a top surface of the substrate 450 shown in FIG. 9. Also, a plurality of optical wave-guides 430, a plurality of surface-emitting lasers 1, and a plurality of light-receiving elements 1' are attached to the top surface of the substrate 450. Each of the LSIs 401a, 401b and 401c includes a semiconductor chip, and is flip-chip mounted on the top surface of the substrate 450. It is noted that each of the LSIs 401a, 401b and 401c may be mounted on the substrate 450 by a method other than flip-chip mounting. The light-receiving elements 1' may be formed as micro tile-shaped elements, and then attached to the substrate 450, or may be formed by epitaxial growth on the substrate 450.

One of the surface-emitting lasers 1 is paired with one of the light-receiving elements 1', each of which is provided to each end of each of the optical wave-guides 430. Accordingly, each of the surface-emitting lasers 1 and each of the light-receiving elements 1' are optically connected to each other through the optical wave-guide 430. Further, an electrode of each of the surface-emitting lasers 1 and each of the light-receiving elements 1' is electrically connected to adjacent ones of the LSIs 401a, 401b and 401c through an electrode provided on the substrate 450. Also, two or more of surface-emitting lasers 1 or the light-receiving elements 1' may be optically connected to each of the optical wave-guides 430.

For example, an output signal (an electrical signal) from the LSI 401a is sent to the surface-emitting laser 1 disposed in the vicinity of the LSI 401a via the electrodes or the like. The surface-emitting laser 1 converts the electrical signal into an optical pulse signal to be emitted to the optical wave-guide 430. The optical pulse signal is converted into an electrical signal by the light-receiving element 1' disposed in the vicinity of the LSI 401b, which is located at an end of the optical wave-guide 430, to become an input signal to the LSI 401b.

According to the electronic apparatus of the present embodiment, data transmission and communications between IC chips can be achieved at extremely high speeds by optical signals. Also, according to the electronic apparatus of the present embodiment, the surface-emitting laser 1 that is a light source of optical signals can have a small laser emission angle and a low element resistance, and optical axes thereof can be matched with each other in a self-aligning manner, such that a micro optical interconnection circuit between IC chips with a high optical coupling efficiency and a low power consumption can be readily achieved.

In the present embodiment, an optical bus may be formed by connecting a plurality of light-receiving elements 1' to a single optical wave-guide 430. With this structure, for example, a clock signal to be shared by a plurality of the LSIs 401a, 401b and 401c can be distributed by the optical wave-guide 430. Further, a plurality of surface-emitting lasers 1 of different emission light wavelengths and a plurality of light-receiving elements 1' of different receiving light wavelengths may be connected to a single optical wave-guide 430. With this structure, for example, a wave-length multiple optical communication can be realized.

Figure 10:
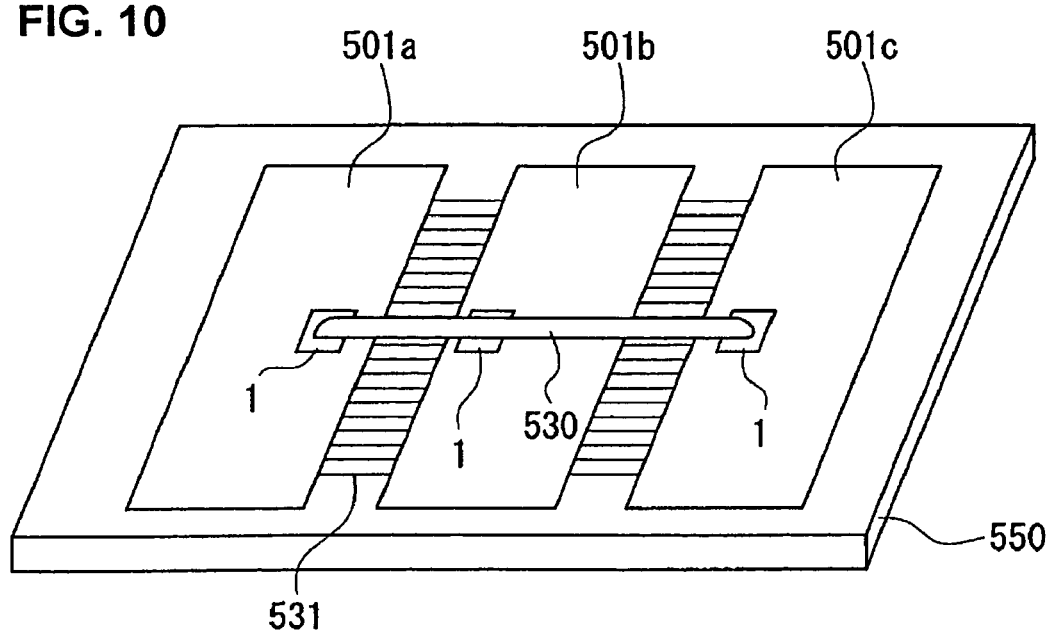
FIG. 10 is a perspective view of an optical interconnection circuit within an IC chip equipped with surface-emitting lasers of the present invention.

FIG. 10 is a perspective view showing an optical-interconnection circuit within an IC chip equipped with surface-emitting lasers 1 according to the present embodiment, which is one example of an electronic apparatus in accordance with the present invention. The electronic apparatus of the present embodiment performs optical communications by using the surface-emitting lasers 1 described above for a plurality of circuit blocks provided on a single integrate circuit chip (IC chip, LSI chip).

Three circuit blocks 501a, 501b and 501c are formed on one integrated circuit chip 550. The integrated circuit chip 550 is composed of a semiconductor chip. The number of circuit blocks formed on the integrated circuit chip 550 is not limited to three, but it may be two or more. Circuits other than the circuit blocks, or electronic elements may be formed on the integrated circuit chip 550.

The circuit blocks 501a, 501b, and 501c constitute a CPU, a memory circuit, an image signal processing circuit, an image signal drive circuit, a communication I/O, various interface circuits, an A/D converter, a D/A converter, and the like. For example, the circuit block 501a constitutes a CPU, the circuit block 501b constitutes a first memory circuit, and the circuit block 501c constitutes a second memory circuit. The circuit blocks 501a, 501b and 501c can be formed on the integrated circuit chip 550 in the form of bipolar integrated circuits, MOS integrated circuits, CMOS integrated circuits, or SOS (Silicon On Sapphire) integrated circuits.

The circuit blocks 501a, 501b, and 501c are electrically connected to each other through metal wirings 531. Further, the surface-emitting laser 1 is connected to the circuit block 501a. The light-receiving element 1' is connected to each of the circuit blocks 501b and 501c. Each of the surface-emitting laser 1 and the light-receiving elements 1' has, for example, an area of several hundred square μm or less and a thickness of several ten or less μm, and is adhered to the surface of the integrated circuit chip 550 with an adhesive or the like. Each of the surface-emitting laser 1 and the light-receiving elements 1' is electrically connected to the circuit block (any one of the circuit blocks 501a, 501b, and 501c).

An optical waveguide 530 is also formed on the integrated circuit chip 550. The optical waveguide 530 is made of a bar-shaped optical waveguide material that is formed over the top surface of the integrated circuit chip 550, the top surfaces of the circuit blocks 501a, 501b and 501c, and the top surfaces of the metal wirings 531. The thickness (height) of the optical waveguide material may preferably have a much larger value than the step differences between the surface of the integrated circuit chip 550 and the circuit blocks 501a, 501b and 501c or between the surface-emitting laser 1 and the light-receiving elements 1 and the metal wirings 531. This is to enhance the efficiency of optical coupling with respect to the optical waveguide 530.

Transparent resin, sol gel glass, and the like may be applied to the optical waveguide material. Further, the optical waveguide material forming the optical waveguide 530 is formed to cover each of the surface-emitting laser 1 and the light-receiving elements 1'. Thus, each of the surface-emitting laser 1 and the light-receiving elements 1' is optically connected by the optical waveguide 530. Moreover, an optical absorption film or an optical reflection film may be formed on the surface of the optical waveguide material to prevent the incidence of disturbance light.

With such a configuration, electrical signals (data) outputted from the circuit block 501a constituting, for example, a CPU, are converted into optical signals by the surface-emitting laser 1 on the circuit block 501a. The optical signals emitted from the surface-emitting laser 1 are incident on the optical waveguide 530 and propagate in the optical waveguide 530. The optical signals are converted into electrical signals by each of the light-receiving elements 1' on the circuit block 501b and the circuit block 501c, and inputted into each of the circuit block 501b and the circuit block 501c.

Thus, according to the present embodiment, it is possible to perform data transmission between the circuit blocks 501a, 501b and 501c on the integrated circuit chip 550 with extremely high speed using the surface-emitting laser 1, the light-receiving elements 1' and the optical waveguide 530. Also, according to the electronic apparatus of the present embodiment, the surface-emitting laser 1 that is a light source of optical signals can have a small laser emission angle and a low element resistance, and optical axes thereof can be matched with each other in a self-alignment manner, such that a micro-optical interconnection circuit in an IC chip with a high optical coupling efficiency and a low power consumption can be readily achieved.

The optical signals propagating in the optical waveguide 530 may be clock signals. For example, it is assumed that a clock signal (optical signal) is emitted from the surface-emitting laser 1 on the circuit block 501a, propagated in the optical waveguide 530, and inputted into the light-receiving elements 1' of the other circuit blocks 501b and 501c. With such a structure, it is possible to operate each of the circuit blocks 501a, 501b and 501c at high speed with a clock signal having a higher frequency than that of the conventional art. Further, in the present embodiment, the circuit blocks 501a, 501b and 501c are electrically connected to each other through metal wirings 531. Accordingly, signals and power that do not require relatively high-speed transmission can be transmitted through the metal wiring lines 531.

Also, in the present embodiment, the optical waveguide 530 is provided on the circuit blocks 501a, 501b and 501c to cross the circuit block 501b. Accordingly, it is possible to shorten the length of path of the optical waveguide 530. The optical waveguide 530, on the integrated circuit chip 550, can be formed regardless of whether it is on the top surfaces of the circuit blocks 501a, 501b and 501c.

Furthermore, the optical waveguide 530 may be provided on the surface of the integrated circuit chip 550 to bypass the circuit blocks 501a, 501b and 501c. By so doing, on the surface of the integrated circuit chip 550, it is possible to enhance the optical coupling efficiency in the optical signal transmission process because the optical waveguide 530 can be provided on an even plane even when the step difference between the surfaces of the circuit blocks 501a, 501b, and 501c and the surfaces of other regions is large. The optical waveguide 530 is not limited to a linear shape as shown in FIG. 10, but it may be formed in a curved shape, a branch shape, or a loop shape.

In the present embodiment shown in FIG. 10, the surface-emitting laser 1 and the light-receiving elements 1' are attached to the circuit blocks 501a, 501b and 501c, respectively, and one optical waveguide 30 connects the surface-emitting laser 1 and the light-receiving elements 1'. However, a plurality of surface-emitting lasers 1 or light-receiving elements 1' may be attached to each of the circuit blocks 501a, 501b and 501c, respectively. Furthermore, each of the surface-emitting laser 1 and the light-receiving elements 1' may be connected to each other by a plurality of optical waveguides 530. As a result, by a plurality of sets of the surface-emitting laser 1, the light-receiving elements 1' and the optical waveguides 530, it is possible to transmit optical signals in parallel and to perform data transmission with higher speed. In the present embodiment shown in FIG. 10, all of the circuit blocks 501a, 501b and 501c are connected by the optical waveguide 530, but only some circuit blocks (e.g., the circuit block 501a and the circuit block 501b) may be connected by the optical waveguide 30.

Moreover, a plurality of the integrated circuit chips 550, shown in FIG. 10, may be mounted on a desired substrate. In this case, the sides of the integrated circuit chips 550 may preferably be arranged to be close to each other on the substrate. Each of the integrated circuit chips 550 may preferably be mounted by a flip-chip technique. As a result, it is possible to compactly mount the integrated circuit chips 550 on the substrate. Further, by the configuration described above, the plurality of integrated circuit chips 550 can be readily connected to each other using the surface-emitting lasers 1, the light-receiving elements 1' and the optical waveguides 530.

Thus, it is possible to achieve a compact and highly efficient large-scaled computer system including the plurality of integrated circuit chips 550.

Figure 11:
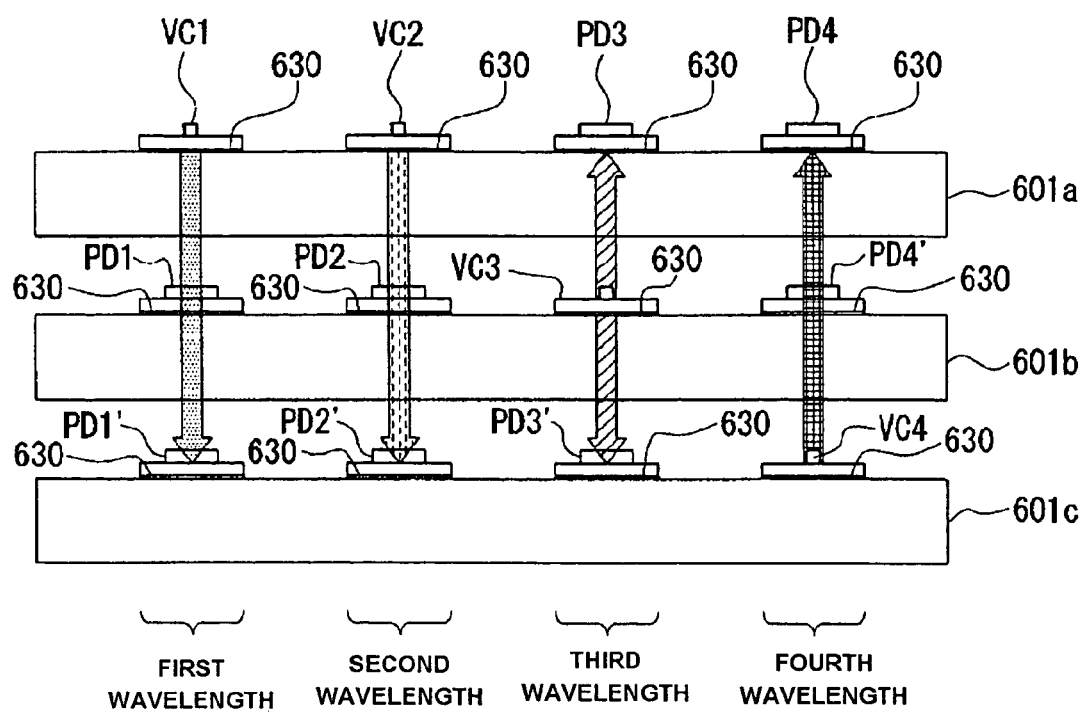
FIG. 11 is a schematic cross-sectional view of an optical interconnection integrated circuit with a laminated layered structure, equipped with surface-emitting lasers of the present invention.

FIG. 11 is a schematic cross-sectional view of an optical-interconnection integrated circuit having a laminated layered structure equipped with the surface-emitting lasers 1 of the present embodiment, which is an example of an electronic apparatus of the present invention. The optical interconnection integrated circuit has a stacked layered structure obtained by overlapping three integrated circuit chips (silicon semiconductor substrates) 601a, 601b and 601c with a transparent adhesive (not shown), such as resin, interposed therebetween. The integrated circuit chips 601a, 601b and 601c are obtained by forming integrated circuits (LSIs, etc.) on a silicon semiconductor substrate. Further, the integrated circuit chips 601a, 601b and 601c may be obtained by forming thin film transistors (TFTs), and the like on a glass substrate. Further, surface-emitting lasers VC1, VC2, VC3 and VC4 are each formed from the surface-emitting laser 1 composed of a micro tile-shaped element. Photo detectors PD1, PD1', PD2, PD2', PD3, PD3', PD4 and PD4' are each formed from a light-receiving element composed of a micro tile-shaped element. Each of the micro tile-shaped elements may be a plate shaped member having a thickness of 1 μm to 20 μm, and length and width of several ten μm to several hundred μm.

Two surface-emitting lasers VC1 and VC2 and two photo detectors PD3 and PD4 are bonded at desired positions to the upper surface of the integrated circuit chip 601a. In other words, the surface-emitting lasers VC1 and VC2 and the photo detectors PD3 and PD4 may be disposed at arbitrary positions in the integrated circuit, without being limited to the peripheral edge portions on the upper surface of the integrated circuit chip 601a.

Gaps between the surface-emitting lasers VC1 and VC2 and the photo detectors PD3 and PD4, respectively, can be made to be very small and for example, the gap may be set to several μm. Further, each of the micro tile-shaped elements is bonded to the upper surface of the integrated circuit chip 601a with a transparent adhesive 630. As the adhesive 630, for example, resin can be used.

One surface-emitting laser VC3 and three photo detectors PD1, PD2, PD4' are bonded to the upper surface of the integrated circuit chip 601b. The surface-emitting laser VC3 and the photo detectors PD1, PD2 and PD4' are bonded to the upper surface of the integrated circuit chip 601b through a transparent adhesive 630. One surface-emitting laser VC4 and three photo detectors PD1', PD2' and PD3' are bonded to the upper surface of the integrated circuit chip 601c. The surface-emitting laser VC4 and the photo detectors PD1', PD2' and PD3' are bonded to the upper surface of the integrated circuit chip 601c through a transparent adhesive 630.

The adhesive 630 may preferably be provided by a liquid droplet ejection method of ejecting liquid droplets containing the adhesive 630 from an ink jet nozzle (not shown) to apply them on the integrated circuit chips 601a, 601b and 601c. By so doing, the amount of the adhesive 30 can be reduced, and design changes, etc. can be readily accommodated, such that the manufacturing cost can be reduced.

Furthermore, when the integrated circuit chips 601a, 601b and 601c are overlapped with an adhesive, the adhesive may preferably be applied by using a liquid droplet ejection method. By so doing, the amount of the adhesive can be reduced, and design changes, etc. can be readily accommodated, such that the manufacturing cost can be reduced.

Further, two photo detectors PD1 and PD1' are disposed to face the light-emission center axis of the surface-emitting laser VC1. Furthermore, two photo detectors PD2 and PD2' are disposed to face the light-emission center axis of the surface-emitting laser VC2. Also, two photo detectors PD3 and PD3' are disposed to face the light-emission center axis of the surface-emitting laser VC3. Furthermore, two photo detectors PD4 and PD4' are disposed to face the light-emission center axis of the surface-emitting laser VC4. Preferably, the surface-emitting lasers VC and the photo detectors PD and PD' may be disposed such that the light receiving center axes of the two photo detectors PD and PD' disposed to face each corresponding one of the surface-emitting lasers lie on the light-emission center axis of each of the surface-emitting lasers VC.

The surface-emitting laser VC1 emits a laser light having a first wavelength, the surface-emitting laser VC2 emits a laser light having a second wavelength, the surface-emitting laser VC3 emits a laser light having a third wavelength, and the surface-emitting laser VC4 emits a laser light having a fourth wavelength. Here, the first to fourth wavelengths are made to be, for example, 1.1 μm or more, when the integrated circuit chips 601a, 601b and 601c are formed with the silicon semiconductor substrates. By so doing, the laser light emitted from the surface-emitting lasers VC1, VC2, VC3 and VC4 can pass through the integrated circuit chips 601a, 601b and 601c. For example, the first wavelength may be set to 1.20 μm, the second wavelength may be set to 1.22 μm, the third wavelength may be set to 1.24 μm, and the fourth wavelength is set to 1.26 μm.

Light having a wavelength of 1.1 μm or less can also pass through a glass substrate. Therefore, when the integrated circuit chips 601a, 601b and 601c are formed with glass substrates, the first to fourth wavelengths may be set to 1.1 μm or less. For example, the first wavelength may be set to 0.79 μm, the second wavelength may be set to 0.81 μm, the third wavelength may be set to 0.83 μm and the fourth wavelength may be set to 0.85 μm.

Each of the photo detectors PD1, PD1', PD2, PD2', PD3, PD3', PD4 and PD4' may preferably have the wavelength selectivity. For example, the photo detectors PD1 and PD1' may detect only light with the first wavelength, the photo detectors PD2 and PD2' may detect only light with the second wavelength, the photo detectors PD3 and PD3' may detect only light with the third wavelength light, and the photo detectors PD4 and PD4' may detect only light with the fourth wavelength. Further, the upper surface or the lower surface of each of the photo detectors PD1, PD1', PD2, PD2', PD3, PD3', PD4 and PD4' may be provided with a thin film, or the like, having the wavelength selectivity, thereby composing light-receiving elements having the wavelength selectivity.

Furthermore, the upper surfaces of the surface-emitting lasers VC1 and VC2 and the photo detectors PD3 and PD4 may preferably be covered with opaque members. Furthermore, the lower surfaces of the photo detectors PD1', PD2' and PD3' and the surface-emitting laser VC4 may preferably be covered with opaque members. By so doing, noises due to stray light can be suppressed.

By the composition described above, the laser light with the first wavelength emitted downward from the surface-emitting laser VC1 passes through the adhesive 630 between the surface-emitting laser VC1 and the integrated circuit chip 601a, the integrated circuit chip 601a, and the adhesive between the integrated circuit chip 601a and the integrated circuit chip 601b, and enters the photo detector PD1, and further passes through the photo detector PD1, the adhesive 630 between the photo detector PD1 and the integrated circuit chip 601b, the integrated circuit chip 601b and the adhesive between the integrated circuit chip 601b and the integrated circuit chip 601c, and enters the photo detector PD1'.

Also, the laser light with the second wavelength emitted downward from the surface-emitting laser VC2 passes through the adhesive 630 between the surface-emitting laser VC2 and the integrated circuit chip 601a, the integrated circuit chip 601a, and the adhesive between the integrated circuit chip 601a and the integrated circuit chip 601b, and enters the photo detector PD2, and further passes through the photo detector PD2, the adhesive 630 between the photo detector PD2 and the integrated circuit chip 601b, the integrated circuit chip 601b and the adhesive between the integrated circuit chip 601b and the integrated circuit chip 601c, and enters the photo detector PD2'.

Further, the laser light with the third wavelength emitted upward from the surface-emitting laser VC3 passes through the adhesive between the integrated circuit chip 601b and the integrated circuit chip 601a, the integrated circuit chip 601a and the adhesive 630 between the integrated circuit chip 601a and the photo detector PD3, and enters the photo detector PD3. The laser light with the third wavelength emitted downward from the surface-emitting laser VC3 passes through the adhesive 630 between the surface-emitting laser VC3 and the integrated circuit chip 601b, the integrated circuit chip 601b and the adhesive between the integrated circuit chip 601b and the integrated circuit chip 601c, and enters the photo detector PD3'.

Further, the laser light with the fourth wavelength emitted upward from the surface-emitting laser VC4 passes through the adhesive between the integrated circuit chip 601c and the integrated circuit chip 601b, the integrated circuit chip 601b and the adhesive 630 between the integrated circuit chip 601b and the photo detector PD4', and enters the photo detector PD4', and further passes through the photo detector PD4', the adhesive between the integrated circuit chip 601b and the integrated circuit chip 601a, the integrated circuit chip 601a and the adhesive 630 between the integrated circuit chip 601a and the photo detector PD4, and enters the photo detector PD4.

Therefore, the optical signal outputted as the laser light with the first wavelength from the surface-emitting laser VC1 is received almost at the same time by the photo detectors PD1 and PD1'. Further, the optical signal outputted as the laser light with the second wavelength from the surface-emitting laser VC2 is received almost at the same time by the photo detectors PD2 and PD2'. Furthermore, the optical signal outputted as the laser light with the third wavelength from the surface-emitting laser VC3 is received almost at the same time by the photo detectors PD3 and PD3'. Furthermore, the optical signal outputted as the laser light with the fourth wavelength from the surface-emitting laser VC4 is received almost at the same time by the photo detectors PD4 and PD4'.

Therefore, among the integrated circuit chip 601a, the integrated circuit chip 601b, and the integrated circuit chip 601c, four optical signals with the first to fourth wavelengths can be simultaneously transmitted and received in parallel to thereby perform two-way communications. In other words, the surface-emitting lasers VC1, VC2, VC3 and VC4 and the photo detectors PD1, PD1', PD2, PD2', PD3, PD3', PD4 and PD4' serve as signal transmitting/receiving devices of optical buses, and four optical signals with the first to fourth wavelengths serve as transmission signals of the optical buses.

According to the above, because the optical interconnection integrated circuit of the present embodiment has the optical buses through which a plurality of optical signals are transmitted and received in parallel among the three integrated circuit chips 601a, 601b and 601c, it is possible to increase the signal transmission speed between the integrated circuit chips, and it is possible to cope with the following problems which may occur when electric signals are transmitted and received by using metal wires:

1) Deviation (skew) in signal transmission timing between the wirings;
2) Necessity of large power for transmission of a high frequency signal;
3) Limitation of the degree of freedom in wiring layout which makes designing difficult;
4) Necessity of impedance matching; and
5) Necessity of countermeasures against earth noise, electro-magnetically induced noise and the like.

Furthermore, in the optical interconnection integrated circuit of the present embodiment, the surface-emitting laser 1 each composing the surface-emitting lasers VC1, VC2 and VC3 can have a small laser emission angle, and a low element resistance, and their optical axes can be matched with one another in a self-alignment manner, such that a minute optical interconnection integrated circuit between IC chips with a high optical coupling coefficient and a low power consumption can be readily provided.

Furthermore, in the optical interconnection integrated circuit of the present embodiment, the plurality of laser lights serving as communication signals of the optical bus are provided with mutually different wavelengths. Therefore, even when plural sets of optical signal transmitting/receiving devices, each of the sets including a light-emitting element and a light-receiving element, are disposed in proximity to one another, it is possible to prevent interference due to stray light and the like, and the device can be made compact. Furthermore, because the optical interconnection integrated circuit of the present embodiment employs the surface-emitting laser 1 as the light-emitting element, it is possible to further increase the communication speed and also to readily form the emitting device (transmitting device) of laser light passing through the plurality of integrated circuit chips laminated in a multi-layer structure. Furthermore, because the optical interconnection integrated circuit of the present embodiment employs the light-receiving element (photo detector) having the wavelength selectivity, it is possible to further prevent the interference due to stray light, and the like, and to further make the device compact.

<Examples of Electronic Apparatus>

Next, examples of electronic apparatuses equipped with the surface-emitting lasers 1 of the present embodiment are described.

Devices equipped with the surface-emitting lasers 1 of the present embodiment can be widely applied to equipment that use laser light. Accordingly, as applied circuits or electronic apparatuses equipped with these devices, optical interconnection circuits, optical fiber communications modules, laser printers, laser beam projectors, laser beam scanners, linear encoders, rotary encoders, displacement sensors, pressure sensors, gas sensors, blood flow sensors, fingerprint sensors, high-speed electric modulation circuits, wireless RF circuits, cellular phones, wireless LANs and the like.

FIG. 12(a) is a perspective view illustrating an example of a cellular phone. In FIG. 12(a), reference numeral 1000 denotes a main body of a cellular phone using the above-described surface-emitting laser 1 as a part of a signal transmission device or a display device, and reference numeral 1001 denotes a display part. FIG. 12(b) is a perspective view illustrating an example of a wristwatch type electronic apparatus. In FIG. 12(b), reference numeral 1100 denotes a watch main body using the above-described surface-emitting laser 1 as a part of a signal transmission device or a display device, and reference numeral 1101 denotes a display part. FIG. 12(c)

is a perspective view illustrating an example of a portable information processing device, such as a word-processor, PC, or the like. In FIG. 12(c), reference numeral 1200 denotes an information processing device, reference numeral 1202 denotes an input part, such as a keyboard, reference numeral 1204 denotes a main body of the information processing device using the above-described surface-emitting laser 1 as a part of a signal transmission device or a display device, and reference numeral 1206 denotes a display part.

Figure 12:
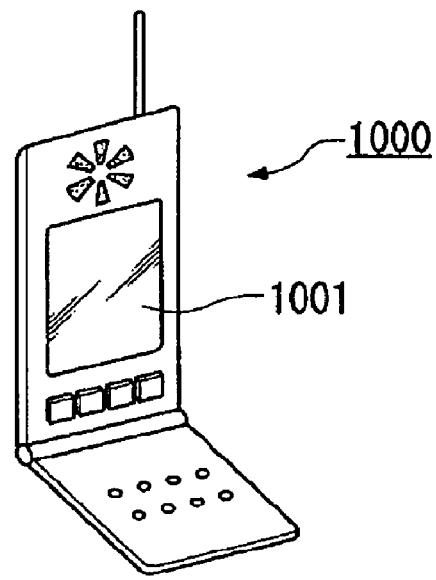
FIG. 12 shows views illustrating concrete examples of electronic apparatuses equipped with surface-emitting lasers of the present invention.
Figure 12:
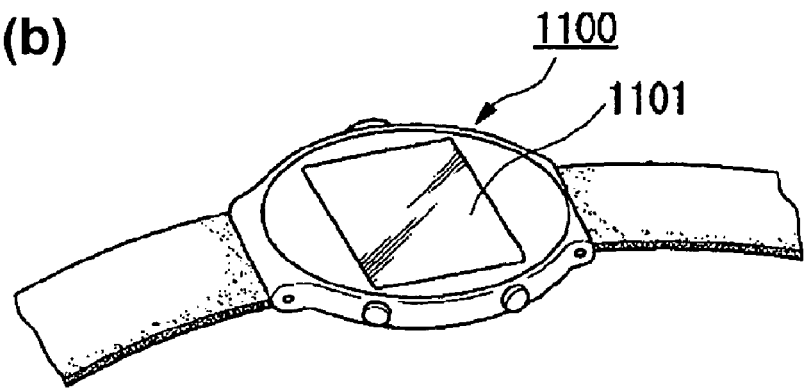
Figure 12:
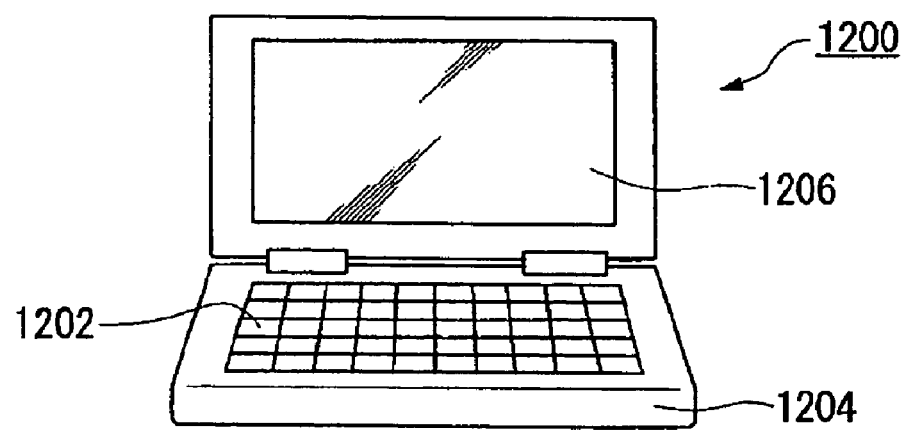

The electronic apparatuses shown in FIG. 12 are equipped with the surface-emitting lasers 1 in accordance with the present embodiment described above, and the surface-emitting laser 1 that is a light source for optical signals can have a smaller laser emission angle, and a smaller element resistance, and their optical axes can be matched with one another in a self-alignment manner, such that compact electronic apparatuses with a high optical coupling efficiency and a low power consumption can be provided at low costs.

The scope of the art of the present invention is not limited to the above-described embodiments, and various kinds of modifications can be made within the scope of the subject matter of the present invention. The concrete materials, layered structures, and the like enumerated in the embodiments are only part of examples and can be accordingly modified.

What is claimed is:

1. A surface-emitting laser comprising a resonator, wherein the resonator includes:
   a light emission surface having a portion that is provided with a lens shaped section, the lens shaped section formed from a semiconductor layer having a bandgap greater than a bandgap corresponding to an energy of a laser light of the surface-emitting laser in a lens shape,
   a columnar section formed in a convex shape on a semiconductor substrate, the light emission surface being defined by an upper surface of the columnar section,
   a contact layer exposed around the lens shaped section on the light emission surface, and
   the contact layer comprises a semiconductor layer having a bandgap smaller than the bandgap of the semiconductor layer composing the lens shaped section.

2. The surface-emitting laser according to claim 1, wherein the lens shaped section is disposed on an upper surface of the contact layer.

3. The surface-emitting laser according to claim 1, wherein an upper electrode that has a ring shape and is in ohmic contact with the contact layer is provided in a region in the upper surface of the contact layer where the lens shaped section is not provided.

4. The surface-emitting laser according to claim 1 wherein the lens shaped section comprises a plurality of layers of different refractive indexes.

5. The surface-emitting laser according to claim 1, wherein the lens shaped section is comprised of a single layer.

6. The surface-emitting laser according to claim 1, wherein the surface-emitting laser is formed in a micro-tile shape.

7. The surface-emitting laser according to claim 1, wherein a dielectric film is arranged around the columnar section defining at least a part of the resonator of the surface-emitting laser.

* * * * *